(12) United States Patent
He et al.

(10) Patent No.: US 7,353,862 B2
(45) Date of Patent: Apr. 8, 2008

(54) LIQUID COOLING DEVICE

(75) Inventors: Li He, Shenzhen (CN); Tsung-Lung Lee, Tu-Cheng (TW)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 151 days.

(21) Appl. No.: 11/241,911

(22) Filed: Oct. 3, 2005

(65) Prior Publication Data

US 2007/0074855 A1   Apr. 5, 2007

(51) Int. Cl.
*F28F 7/00* (2006.01)
*F28D 15/00* (2006.01)
*H05K 7/20* (2006.01)

(52) U.S. Cl. .............. 165/104.33; 165/80.4; 361/699; 361/700

(58) Field of Classification Search ........... 165/80.4, 165/104.21, 104.33, 80.3, 104.34; 361/699–700, 361/695, 697
See application file for complete search history.

(56) References Cited

U.S. PATENT DOCUMENTS

| | | | |
|---|---|---|---|
| 4,854,377 A | 8/1989 | Komoto et al. | |
| 5,285,347 A | 2/1994 | Fox et al. | |
| 5,646,824 A * | 7/1997 | Ohashi et al. | 361/699 |
| 5,731,954 A * | 3/1998 | Cheon | 361/699 |
| 6,504,720 B2 * | 1/2003 | Furuya | 361/699 |
| 6,840,310 B2 * | 1/2005 | Tonosaki et al. | 165/104.21 |
| 7,028,761 B2 * | 4/2006 | Lee et al. | 165/104.33 |
| 7,149,084 B2 * | 12/2006 | Matsushima et al. | 361/699 |
| 2003/0214783 A1 * | 11/2003 | Narakino et al. | 361/687 |
| 2005/0178529 A1 * | 8/2005 | Suzuki | 165/80.4 |
| 2005/0241803 A1 * | 11/2005 | Malone et al. | 165/80.4 |
| 2007/0044943 A1 * | 3/2007 | He et al. | 165/104.33 |

FOREIGN PATENT DOCUMENTS

| | | |
|---|---|---|
| CN | 2612070 Y | 4/2004 |
| TW | 555073 | 9/2003 |

* cited by examiner

*Primary Examiner*—Tho Duong
(74) *Attorney, Agent, or Firm*—Morris Manning Martin LLP; Tim Tingkang Xia, Esq.

(57) ABSTRACT

A liquid cooling device (10) includes a heat sink (12), a panel (14) distant from the heat sink, a heat transfer member includes a heat exchanger (22) thermally engaging with the heat sink and at least one heat pipe (24), a duct (16) connecting with the panel, a flexible tube (18) connected to the duct and the heat exchanger. Therefore, the panel, the duct, the flexible tube and the heat exchanger cooperatively form a hermetical liquid container filled with liquid therein. The at least one heat pipe is extended in the liquid container and submerged in the liquid to transfer heat from one place near to the heat sink to another place in the panel.

19 Claims, 4 Drawing Sheets

LIQUID COOLING DEVICE

BACKGROUND

1. Field

The present invention relates to a liquid cooling device, and more particularly to a liquid cooling device used to cool a heat-generating device mounted within a computer system.

2. Related Art

Boom of electronic technology promotes quick evolutions and rife applications of computers. Nowadays, personal computers are prevalently used in a variety of fields concerning study, work and life of human. A central processing unit (CPU) is a core of a computer system, as we know. Computers are ceaselessly updated to have the CPUs in higher frequency and higher speed. CPUs of these computers accordingly generate an increasing amount of heat which must be timely removed to enable the CPUs to retain stable operation.

Recently, some kinds of liquid are widely used as heat-transfer media contained in cooling devices to convey heat from one place to another place. Water is a preferred one among these kinds of liquid, because water has great specific heat and does not contaminate environment. Another reason for water being popular in liquid cooling system is that water has a low cost.

Taiwan Patent Issue No. 555073 disclosed a liquid cooling device. The cooling device comprises a heat absorbing box for containing liquid therein, a pump and pipes connecting the pump to the box to form a liquid circulation loop. A plurality of ribs is formed in the box to enhance heat-exchange between the liquid and the box. Unfortunately, the box itself is too small in volume to provide enough heat-exchange area. Additionally, most heat absorbed by the box is dissipated to environment by means of circulation of the liquid; thus, speed of the heat dissipation is restrained.

China Patent Issue No. 2612070 also taught a liquid cooling device. The cooling device provides a larger heat-exchange area in comparison with the cooling device disclosed in Taiwan Patent Issue No. 555073. However, the cooling device is heavy, and its weight is totally exerted to a printed circuit board on which the cooling device is positioned. The printed circuit board is subject to damage as a result of the overload of the cooling device. Secondly, heat-convey pipes in the cooling device are designed to exchange heat with a heat sink by repeatedly extending through the heat sink, whereby the heat-convey pipes must be formed with a large number of U-turns. Such a design makes the heat-convey pipes expansive and makes the assembly between the heat-convey pipes and the heat sink difficult and laborious. Furthermore, the U-turns of the heat-convey pipes are subject to corrosion since they create areas of stress concentration.

Moreover, each of the cooling devices above-mentioned utilizes a pump to enhance the circulation of the liquid in the cooling devices. Pumps are expensive devices, and consume power when operate.

SUMMARY

Accordingly, what is needed is a liquid cooling device which is easily to be constructed at a low cost, while the liquid cooling device can effectively remove heat from a heat-generating device.

A liquid cooling device in accordance with a preferred embodiment of the present invention comprises a heat sink, a panel distant from the heat sink, a heat transfer member comprises a heat exchanger thermally engaging with the heat sink and at least one heat pipe, a duct connecting with the panel, a flexible tube connected to the duct and the heat exchanger. The panel, the duct, the flexible tube and the heat exchanger cooperatively form a hermetical liquid container filled with liquid therein. The at least one heat pipe is extended in the liquid container and submerged in the liquid to transfer heat from one place to another place in the liquid container.

Other advantages and novel features will become more apparent from the following detailed description when taken in conjunction with the accompanying drawings, in which:

DETAILED DESCRIPTION OF THE PREFERRED EMBODIMENTS

Figure 1:
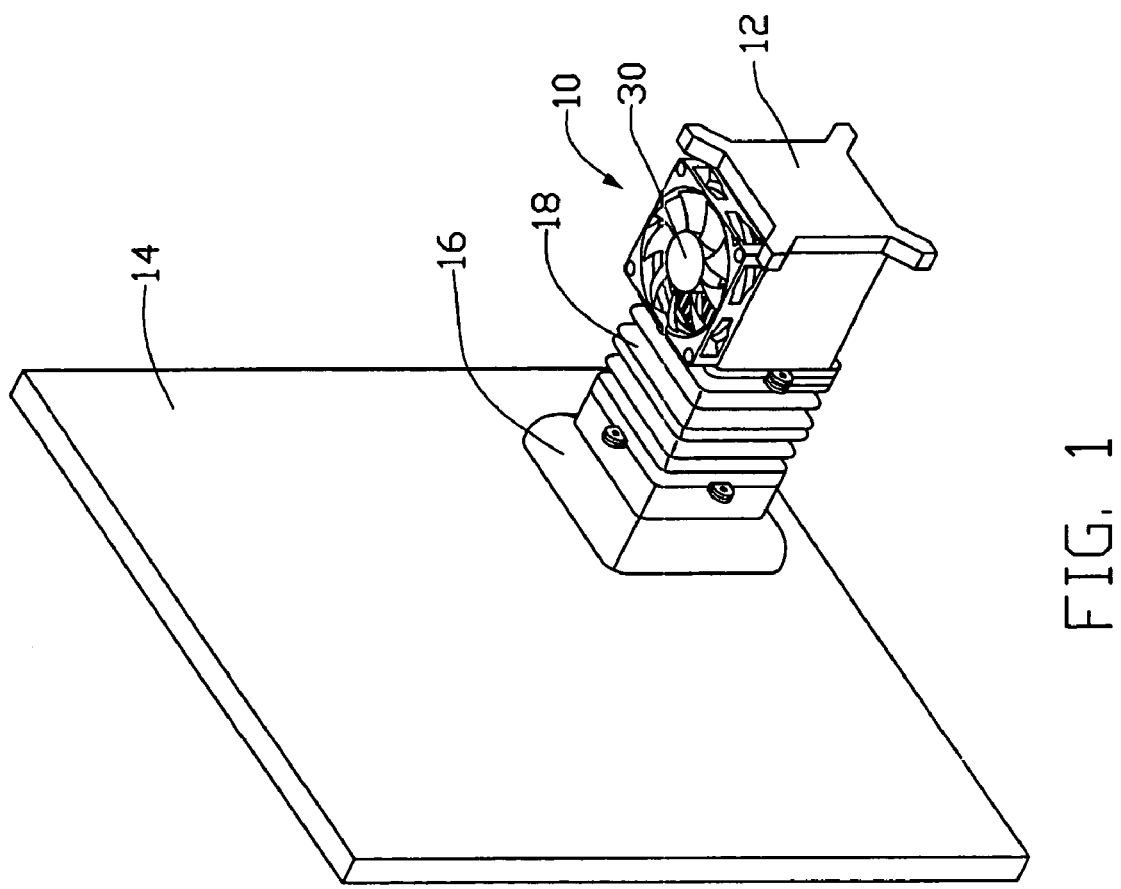
FIG. 1 is an assembled, isometric view of a liquid cooling device in accordance with a preferred embodiment of the present invention.
Figure 2:
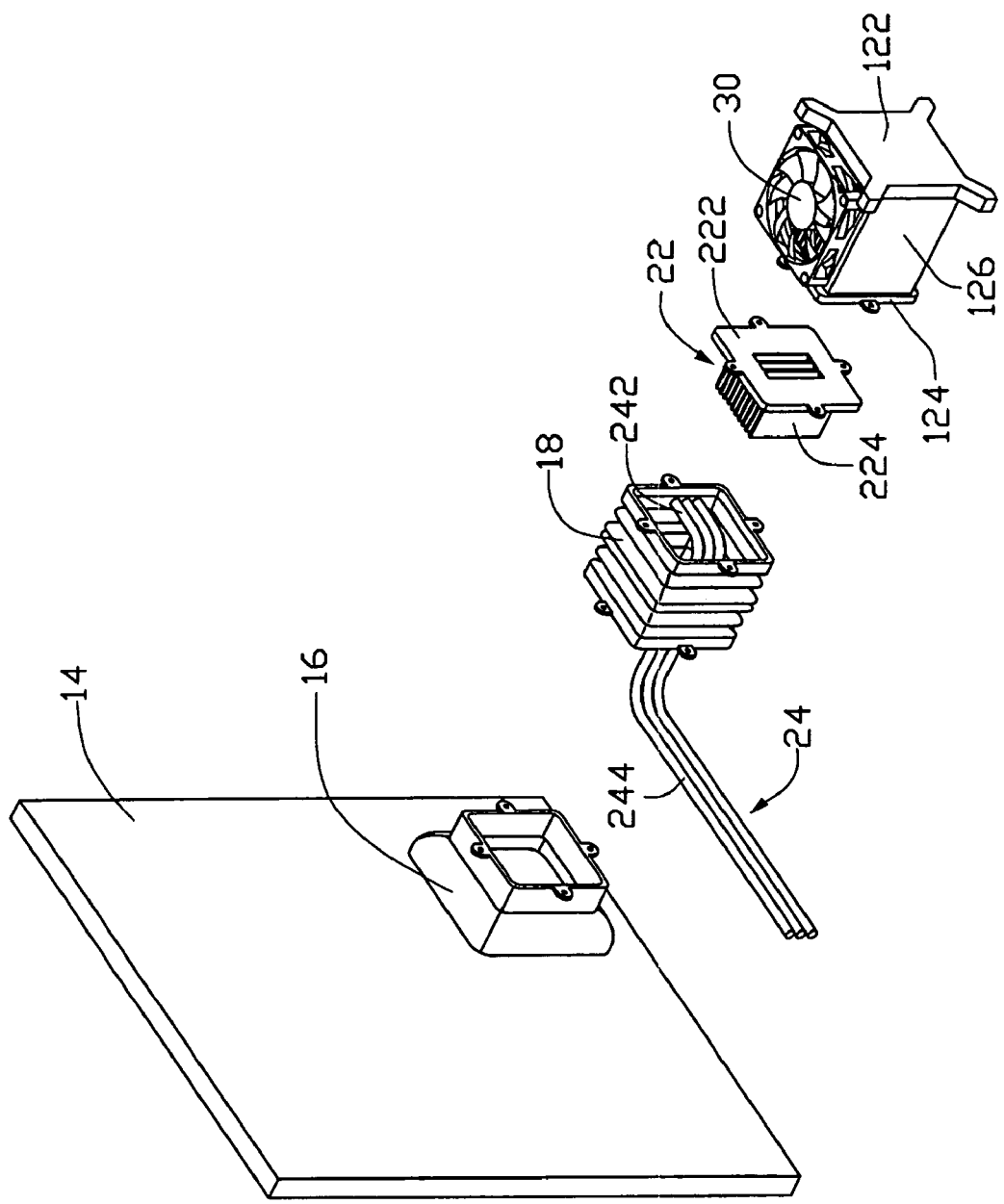
FIG. 2 is a partially exploded view of FIG. 1.

Referring to FIGS. 1-2, a liquid cooling device 10 of a preferred embodiment of the invention comprises a heat sink 12, a panel 14 of an electronic device (not shown) in which a heat-generating component (not shown) is mounted, a duct 16, a flexible tube 18 and a heat-transfer member. In the preferred embodiment, the heat-transfer member comprises a heat exchanger 22 and three heat pipes 24 (particularly see FIG. 2). The duct 16 is hermetically connected to the panel 14. The flexible tube 18 is hermetically connected to the duct 16. The heat exchanger 22 is hermetically connected to the flexible tube 18; thus, the liquid cooling device 10 is a hermetical liquid container. In the preferred embodiment, the heat sink 12 functions as a heat-receiving element, and the panel functions as a heat-dissipating element.

The heat sink 12 comprises a flat chassis 122 for absorbing heat from the heat-generating component (not shown) which is an electronic component such as a CPU or an IC package, a flat plate 124 parallel to the chassis 122 and a plurality of fins 126 extending between the chassis 122 and the plate 124.

The panel 14 defines a chamber (not labeled) therein. The duct 16 has an end portion thereof secured to an inner side of the panel 14. The duct 16 has another end portion thereof connected to the flexible tube 18. The duct 16 is communicated with both of the chamber in the panel 14 and the flexible tube 18 to thereby form a room.

The heat exchanger 22 comprises a base 222 thermally contacting the plate 124, and a plurality of heat exchanging flakes 224 extending perpendicularly from the base 222. That is, the heat sink is arranged between the heat-generating component and the heat exchanger 22 to transfer heat from the heat-generating component to the heat exchanger 22.

Each heat pipe 24 comprises an evaporating segment 242 (heat-absorbing segment) and a condensing segment 244 (heat-discharging segment) distal from the evaporating segment 242. In the preferred embodiment, the evaporating segment 242 of each heat pipe 24 is secured to the base 222 of the heat exchanger 22; the condensing segment 244 is freely extended in the panel 14. The other part of each heat pipe 24 between the condensing segment 244 and the evaporating segment 242 is received in the duct 16 and the flexible tube 18.

The flexible tube 18 at an end portion thereof is connected to the duct 16. The flexible tube 18 at an opposite end portion thereof joints with the base 222 and encloses the flakes 224. Sealing pads (not shown) are arranged between the flexible tube 18 and the duct 16, and between the flexible tube 18 and the base 222 to ensure that the liquid cooling device 10 is totally hermetical to an outside of the liquid cooling device 10.

The liquid cooling device 10 is totally filled with liquid, which is water in this preferred embodiment. That means water fills the chamber of the panel 14, the duct 16 and the flexible tube 18; thus, in the preferred embodiment the heat exchange flakes 224 and the heat pipes 24 are submerged in water.

When the liquid cooling device 10 works, the heat sink 12 absorbs heat from the heat-generating component through the flat chassis 122. The heat absorbed by the heat sink 12 is transferred to the fins 126 and the plate 124. The heat on the fins 126 is dissipated to a surrounding environment and the heat on the plate 124 is further absorbed by the base 222 and spread to the flakes 224. The liquid around the flakes 224 is then heated. The evaporating segments 242 of the heat pipes 24 receive the heat from the flakes 224 and the liquid therearound, and convey the heat to the condensing segments 244 distant from the heat-generating component. The condensing segments 244 discharge the heat to the liquid contained in the panel 14. The heat absorbed by the liquid contained in the panel 14 is further transferred to the ambient environment through a large exterior surface of the panel 14. To enhance heat dissipation efficiency of the fins 126, a fan 30 is mounted on the heat sink 12.

In the preferred embodiment, the liquid only needs to fill the cooling device 10, without circulation in the cooling device 10. Therefore, no dynamic force is exerted on joints of different parts of the cooling device 10 by the liquid. Accordingly, cost to seal the cooling device 10 is low and the reliability of the sealing is high. Additionally, no pump is needed to drive the liquid to circulate in the cooling device 10. Thus, cost to provide a pump is eliminated. The cooling device 10 consumes no electric power during operation thereof, except the fan 30.

The flakes 224 of the heat exchanger 22 are completely submerged in the liquid. This enhances heat-exchange area between the heat exchanger 22 and the liquid. The larger exterior surface of the panel 14 enhances dissipation of the heat to the ambient environment. The heat pipes 24 can quickly convey heat from a place near the heat-generating component to another place remote from the heat-generating component. Since the heat pipes 24 are heat exchanged in liquid, the heat pipes 24 are not necessary to form with any U-turn in order to increase the areas of heat exchange as when the heat pipes are heat exchanged with metal fins in the conventional art.

The flexible tube 18 renders it facile to assemble or disassembly the cooling device 10 to the heat-generating component, due to the flexibility of the tube 18. The position of the heat sink 12 is adjustable due to the flexibility of the flexible tube 18, whereby the heat sink 12 can be more easily to be attached to the heat-generating component. Furthermore, if the heat-generating component has a different height due to a manufacturing tolerance or different specifications, such a difference in height can be easily compensated by the adjustment of the position of the heat sink 12. Finally, in the present embodiment, only a minor part of weight of the liquid cooler device 10 is exerted to the heat-generating component which is usually mounted on a printed circuit board (not shown); thus, the printed circuit board for mounting the heat-generating component is not subject to damage due to the weight of the liquid cooler device 10.

Figure 3:
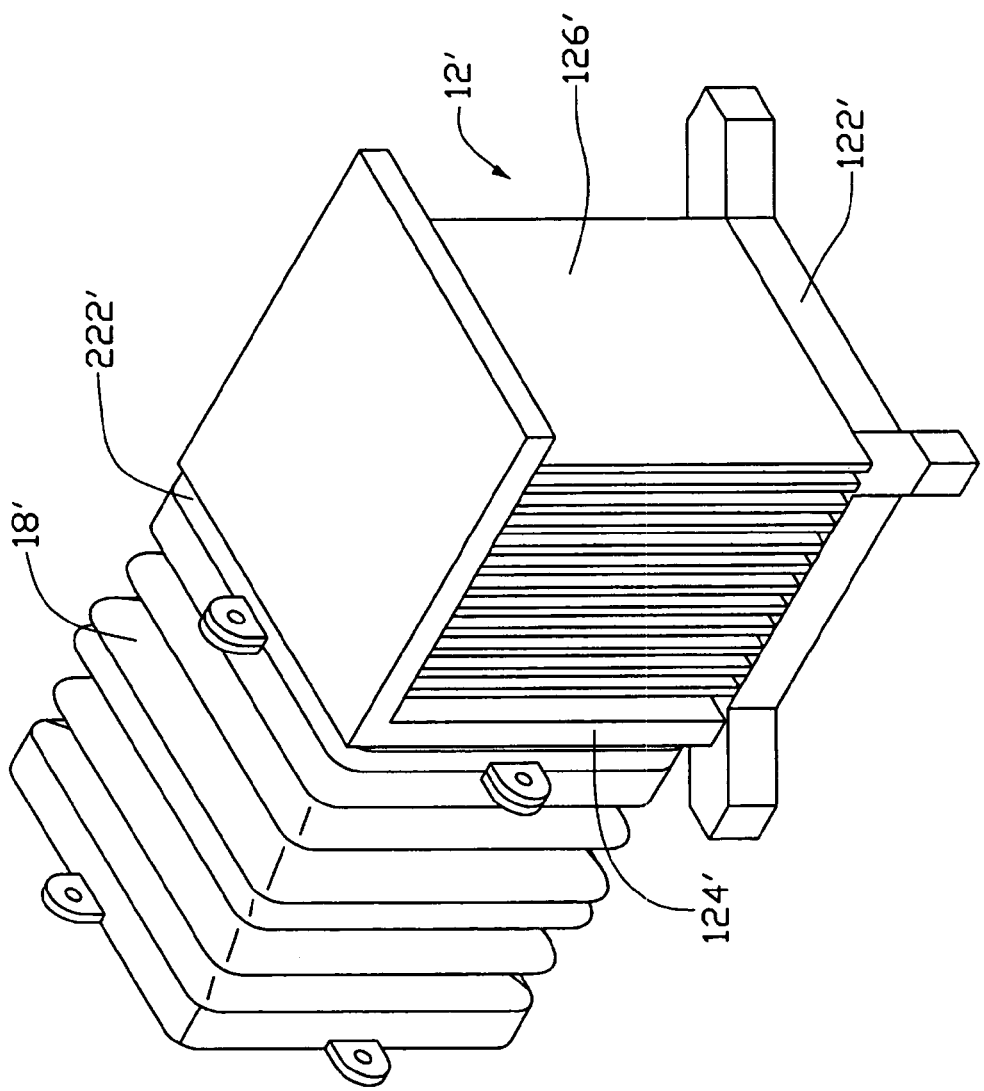
FIG. 3 is an isometric view of a part of a liquid cooling device in accordance with a second embodiment of the present invention.

As shown in FIG. 3 which shows a part of a liquid cooling device in accordance with a second embodiment, a heat sink 12' comprises a chassis 122' for contacting a heat-generating component, a plate 124' extending perpendicularly to the chassis 122' and a plurality of fins 126' extending from the chassis 122' and disposed between the chassis 122' and the plate 124'. A base 222' of a heat exchanger thermally contacts the plate 124' of the heat sink 12'. A flexible tube 18' joints the base 222'. Other elements can be referenced to the description of the previous preferred embodiment and are omitted here from. This embodiment is different from the previous preferred embodiment in that the chassis 122' is oriented in a direction perpendicular to an extending direction of the liquid cooling device and the fan 30 is omitted from this embodiment. A part of heat absorbed by the chassis 122' is transmitted to the fins 126' and then to the surrounding environment by natural convention. The other part of the heat is transmitted to the liquid in the flexible tube 18' via the plate 124' and the base 222'.

Figure 4:
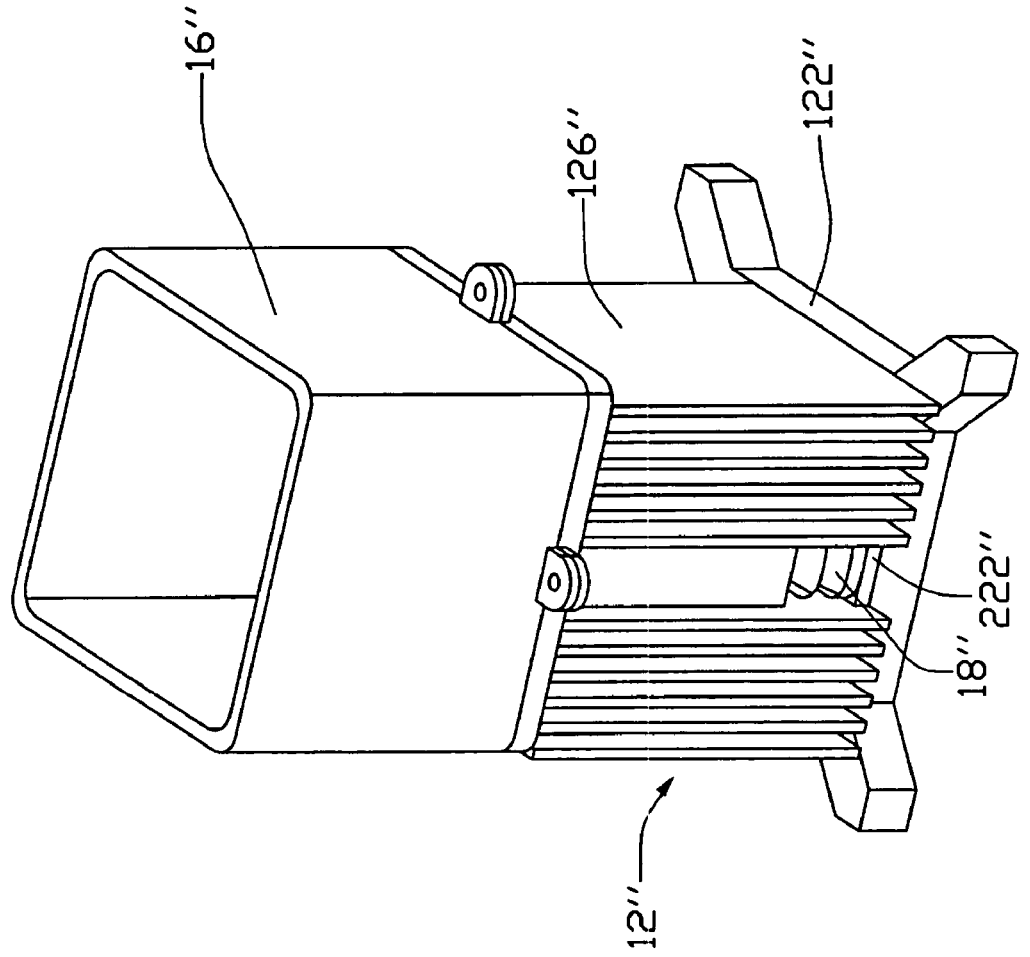
FIG. 4 is an isometric view of a part of a liquid cooling device in accordance with a third embodiment of the present invention.

As shown in FIG. 4 which shows a part of a liquid cooling device in accordance with a third embodiment, a heat sink 12" comprises a chassis 122" for contacting a heat-generating component and a plurality of fins 126" formed on the chassis 122". A flexible tube 18" and a heat exchanger are arranged in the fins 126". A base 222" of the heat exchanger thermally contacts the chassis 122". One end of the tube 18" is engaged with a duct 16" and another end of the tube 18" is engaged with the base 222" which is attached to the chassis 122" of the heat sink 12". Other elements can be referenced to the description of the first preferred embodiment and are omitted here from. Different from the first embodiment, no fan is used in this embodiment. Furthermore, since the flexible tube 18" and the heat exchanger including the base 222" are received in the fins 126", the liquid cooling device in accordance with this third embodiment can be more compact so it is suitable for use in a computer or an electronic apparatus with a small size.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A liquid cooling device comprising:
   a heat sink;
   a panel of an electronic device, distant from the heat sink;
   a heat transfer member comprising a heat exchanger thermally engaging with the heat sink, and at least one heat pipe;
   a duct connecting with the panel;
   a flexible tube connected to the duct and the heat exchanger, wherein the panel, the duct, the flexible tube and the heat exchanger cooperatively form a hermetical liquid container; and
   liquid filling the liquid container;

wherein the at least one heat pipe is extended in the hermetical liquid container and submerged in the liquid to transfer heat from one place to another place in the liquid container.

2. The liquid cooling device of claim 1, wherein the heat exchanger comprises a base contacting the heat sink and a plurality of flakes extending from the base and submerged in the liquid.

3. The liquid cooling device of claim 2, wherein the flexible tube joints the base of the heat exchanger and encloses the flakes.

4. The liquid cooling device of claim 1, wherein the at least one heat pipe comprises a heat-absorbing segment fixed to the heat exchanger and a heat-discharging segment freely extended to the panel.

5. The liquid cooling device of claim 4, wherein the panel defines a chamber therein communicating with the duct, and wherein the heat-discharging segment of the at least one heat pipe is extended in the chamber.

6. The liquid cooling device of claim 1, wherein the heat sink comprises a chassis, and a plurality of fins extending from the chassis.

7. The liquid cooling device of claim 6, wherein the heat sink further comprises a plate parallel to the chassis, and wherein the heat exchanger thermally contacts the plate.

8. The liquid cooling device of claim 6, wherein the flexible tube and the heat exchanger are arranged in the fins of the heat sink and the heat exchanger thermally contacts the chassis.

9. The liquid cooling device of claim 1, wherein a fan is mounted onto the heat sink to enhance heat dissipation efficiency of the heat sink.

10. A liquid cooling device comprising:
a heat-receiving element;
a heat-dissipating element remote from the heat-receiving element;
a tubular element having an end thereof engaging with the heat-dissipating element;
a heat transfer member fixed to an opposite end of the tubular element, whereby the heat-dissipating element, the tubular element and the heat transfer member cooperatively form a hermetical container; and
liquid filling the liquid container;
wherein the heat transfer member comprises a heat exchanger exchanging heat with the heat-receiving element, at least one heat pipe submerged in the liquid and transferring heat from the heat exchanger to the heat-dissipating element.

11. The liquid cooling device of claim 10, wherein the tubular element comprises a flexible portion along the tubular element to render a position of the heat-receiving element adjustable relative to a position of the heat-dissipating element.

12. The liquid cooling device of claim 11, wherein the flexible portion joints the heat exchanger.

13. The liquid cooling device of claim 10, wherein the heat-receiving element comprises a plurality of fins for enlarging heat dissipating area, and wherein the heat exchanger comprises a plurality of flakes for providing a large heat exchanging area for the heat exchanger to exchange heat with the liquid.

14. The liquid cooling device of claim 10, wherein the heat-dissipating element composes a panel of an electronic device having a chamber defined therein to contain the liquid.

15. The liquid cooling device of claim 10, wherein the at least one heat pipe is fixed to one of the heat exchanger and the heat-dissipating element.

16. A liquid cooling device, comprising:
a panel of an electronic device;
a flexible tube hermetically connecting with the panel; and
a heat sink comprising a plate and a plurality of fins;
a fan mounted on the heat sink to generate a convection airflow flowing between the fins; and
a heat exchanger hermetically connecting with the flexible tube and thermally contacting the plate;
wherein the panel and the flexible tube are filled with liquid therein; and
wherein the heat exchanger comprises a plurality of flakes received in the flexible tube and submerged in the liquid.

17. The liquid cooling device of claim 16, wherein the heat exchanger comprises a base which contacts the plate and engages with the flexible tube.

18. The liquid cooling device of claim 17, wherein at least one heat pipe is secured to the base of the heat exchanger and freely extends to the panel to transfer heat from the heat exchanger to the panel.

19. The liquid cooling device of claim 16, wherein a duct is hermetically connected between the panel and the flexible tube.

\* \* \* \* \*